(12) United States Patent
de Lima et al.

(10) Patent No.: US 8,884,620 B2
(45) Date of Patent: Nov. 11, 2014

(54) RF BODY COIL FOR REDUCED ACOUSTIC NOISE IN AN MR SYSTEM

(75) Inventors: Washington de Lima, Florence, SC (US); Timothy John Havens, Florence, SC (US); Saikat Saha, Florence, SC (US); Tesfaye Kebede Kidane, Florence, SC (US)

(73) Assignee: General Electric Company, Schenectady, NY (US)

( * ) Notice: Subject to any disclaimer, the term of this patent is extended or adjusted under 35 U.S.C. 154(b) by 638 days.

(21) Appl. No.: 13/108,453

(22) Filed: May 16, 2011

(65) Prior Publication Data

US 2012/0293173 A1    Nov. 22, 2012

(51) Int. Cl.
*G01V 3/00* (2006.01)
*G01R 33/34* (2006.01)
*G01R 33/385* (2006.01)

(52) U.S. Cl.
CPC .... *G01R 33/34007* (2013.01); *G01R 33/34046* (2013.01); *G01R 33/3854* (2013.01)
USPC .......................................... 324/318; 324/322

(58) Field of Classification Search
USPC ............................ 324/300–322; 600/407–445
See application file for complete search history.

(56) References Cited

U.S. PATENT DOCUMENTS

| | | | |
|---|---|---|---|
| 5,489,848 A * | 2/1996 | Furukawa | 324/318 |
| 5,841,279 A | 11/1998 | Hayashi | |
| 6,437,568 B1 | 8/2002 | Edelstein | |
| 6,564,900 B1 | 5/2003 | Dean | |
| 7,141,974 B2 | 11/2006 | Edelstein et al. | |
| 7,375,526 B2 | 5/2008 | Edelstein et al. | |
| 7,936,170 B2 | 5/2011 | Saha et al. | |
| 2007/0035297 A1 * | 2/2007 | Kitagawa | 324/309 |
| 2007/0290686 A1 | 12/2007 | Goldhaber | |

FOREIGN PATENT DOCUMENTS

| | | |
|---|---|---|
| CN | 201398968 Y | 2/2010 |
| JP | 2001145610 A | 5/2001 |
| JP | 2002085378 A | 3/2002 |

OTHER PUBLICATIONS

Search Report and Written Opinion for corresponding PCT Application No. PCT/US2012/37931, dated Sep. 13, 2012.

* cited by examiner

*Primary Examiner* — Louis Arana
(74) *Attorney, Agent, or Firm* — Ziolkowski Patent Solutions Group, SC

(57) ABSTRACT

An RF body coil having enhanced acoustic deadening properties for an MR scanning apparatus is disclosed. The RF body coil includes an RF support form and RF electronics affixed to the RF support form, with the RF electronics comprising a plurality of RF legs. The RF support form further includes an inner structural layer, an outer structural layer, and a middle layer sandwiched between the inner structural layer and the outer structural layer, the middle layer comprising a layer of viscoelastic material configured to increase the mechanical damping of the RF body coil so as to reduce RF body coil vibration.

20 Claims, 3 Drawing Sheets

RF BODY COIL FOR REDUCED ACOUSTIC NOISE IN AN MR SYSTEM

BACKGROUND OF THE INVENTION

Embodiments of the invention relate generally to an MR system and, more particularly, to an RF coil having enhanced acoustic deadening properties.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals is digitized and processed to reconstruct the image using one of many well known reconstruction techniques.

In existing MR systems, one problem that is encountered is the loud acoustic noise generated by the system. The noise level generated by the MR system can become uncomfortably loud, both for the patient, or subject, and for the operators. The source of such acoustic noise can be many and varied, however, in general, the noise can be attributed to vibration of an RF coil included in the MR system that surrounds the subject whose purpose is to direct RF energy toward the subject or receive RF energy from the subject, in carrying out the scanning process. The noise/vibration from the RF coil is due to Lorentz forces applied to a gradient coil of the MR system that result from an interaction of a static magnetic field and electrical current, with the Lorentz forces thereby creating vibrations in the gradient coil. The vibrations Structural borne and airborne noise generated in the gradient coil from the vibrations reach the RF body coil, which in turn vibrates and consequently radiates acoustic noise into the patient bore of the MR system.

The acoustic noise from the RF coil is difficult to control due to its close proximity to the patient, or subject, bore. There have been attempts at reducing the acoustic noise from the RF coil. Such attempts have included breaking up the RF conductor, where possible, to reduce eddy currents and constrained layer damping to reduce the RF support form vibration. These attempts, however, have not been able to eliminate all of the acoustic noise from the RF coil.

It would therefore be desirable to have an RF coil having a reduced acoustic output by providing vibration isolation between the RF conductors and the RF support form as well as providing damping to reduce the vibration from the RF conductor to the RF support form.

BRIEF DESCRIPTION OF THE INVENTION

In accordance with one aspect of the invention, an RF body coil for an MR scanning apparatus includes an RF support form and RF electronics affixed to the RF support form, with the RF electronics comprising a plurality of RF legs. The RF support form further includes an inner structural layer, an outer structural layer, and a middle layer sandwiched between the inner structural layer and the outer structural layer, the middle layer comprising a layer of viscoelastic material configured to increase the mechanical damping of the RF body coil so as to reduce RF body coil vibration.

In accordance with another aspect of the invention, a method of constructing an RF body coil includes the steps of providing an RF support form of a generally cylindrical shape having an interior surface facing a patient bore and an exterior surface and affixing an RF conductor to the RF support form, the RF conductor comprising a plurality of RF antennas. The step of providing the RF support form further includes providing an inner structural layer, providing an outer structural layer, and including a middle layer of viscoelastic material sandwiched between the inner structural layer and the outer structural layer.

In accordance with yet another aspect of the invention, a magnetic resonance imaging (MRI) system includes an RF transceiver system to acquire MR images and a gradient coil assembly positioned about a bore of a magnet to impress a polarizing magnetic field, wherein the gradient coil assembly includes a polarizing magnet and RF body coil. The RF body coil further includes an RF support form and RF electronics affixed to the RF support form and having a plurality of RF legs. The RF support form includes a layer of viscoelastic material embedded therein, with the layer of viscoelastic material configured to increase the mechanical damping of the RF body coil so as to reduce RF body coil vibration.

Various other features and advantages will be made apparent from the following detailed description and the drawings.

BRIEF DESCRIPTION OF THE DRAWINGS

The drawings illustrate embodiments presently contemplated for carrying out the invention.

In the drawings.

DETAILED DESCRIPTION

Figure 1:
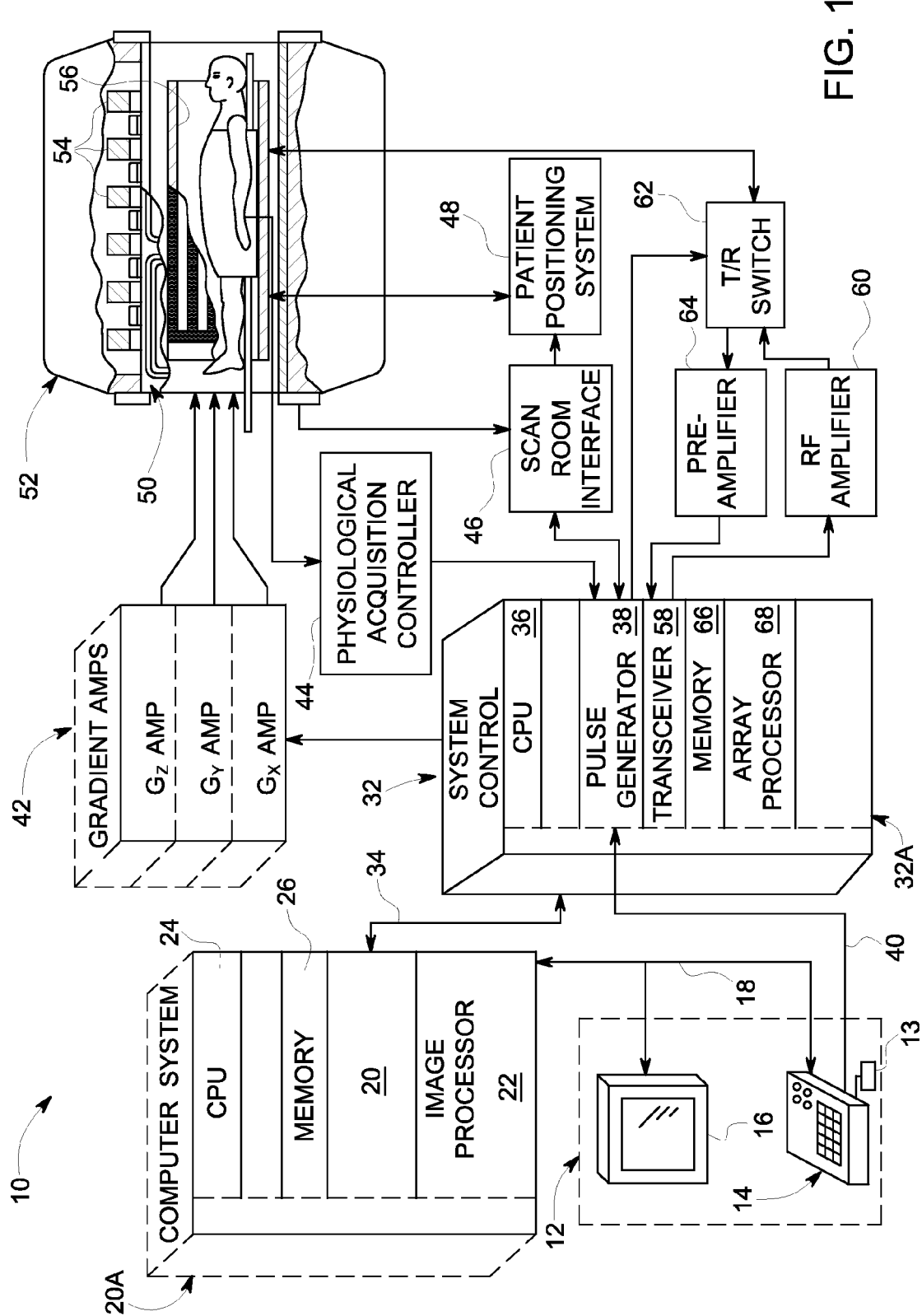
FIG. 1 is a schematic block diagram of an exemplary MR imaging system for use with an embodiment of the invention.

Referring to FIG. 1, the major components of a magnetic resonance imaging (MRI) system 10 incorporating an embodiment of the invention are shown. The operation of the system is controlled for certain functions from an operator console 12 which in this example includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These modules include an image processor module 22, a CPU module 24 and a memory module 26, known in the art as a frame buffer for storing image data arrays. The computer system 20 communicates with a separate system control 32 through a high speed serial link 34. The input device 13 can include a mouse, joystick, keyboard, track ball, touch activated screen, light wand, voice control, card reader, push-button, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a resonance assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory. In response to commands received from the operator console 12 or as otherwise directed by the system software, this image data may be archived in long term storage or it may be further processed by the image processor 22 and conveyed to the operator console 12 and presented on the display 16.

Figure 2:
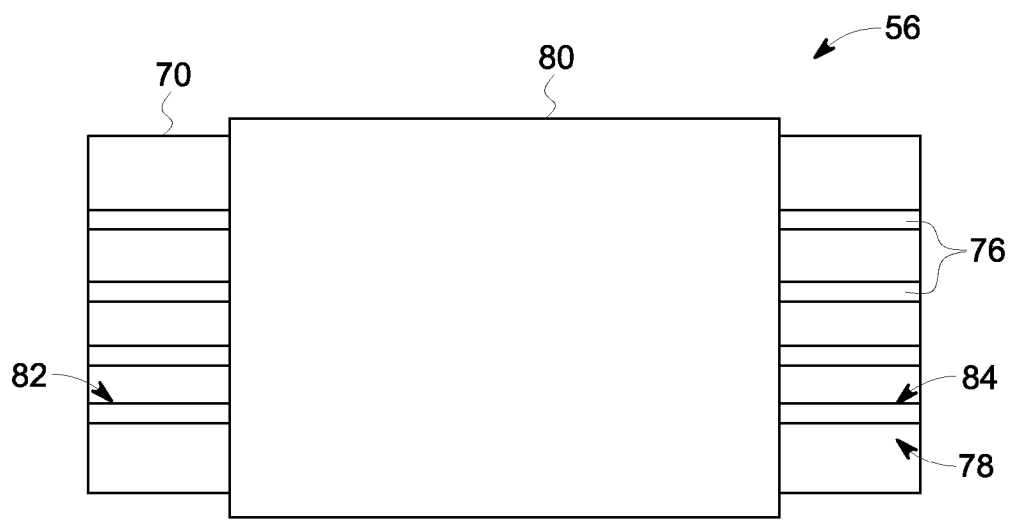
FIG. 2 is a side view of an RF body coil for use in the MR imaging system of FIG. 1 according to an embodiment of the invention.
Figure 3:
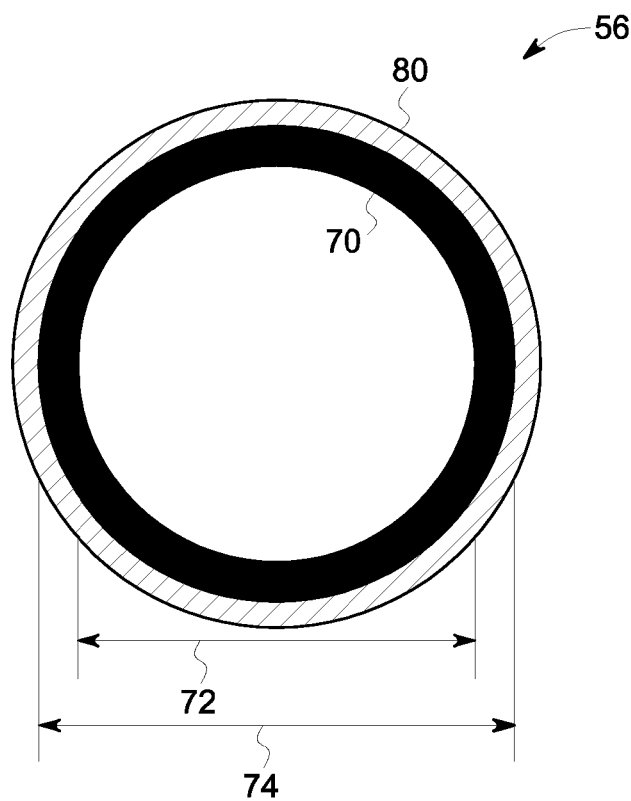
FIG. 3 is a front cross-sectional view of the RF body coil of FIG. 2 according to an embodiment of the invention.

Referring now to FIGS. 2 and 3, side and cross-sectional front views of an RF body coil 56 constructed in accordance with an embodiment of the invention are shown. The RF coil 56 includes an RF support form 70 that is cylindrical, with the RF support form 70 having an inner diameter 72 and an outer diameter 74. The RF support form 70 is normally formed of a composite or fiberglass material and surrounds the patient. Positioned about the RF support form 70 (i.e., at the radial location of outer diameter 74) is a plurality of RF legs or antennas 76 that collectively form an RF conductor 78 (i.e., "RF electronics") that function to generate or receive the RF energy used in the scanning process.

As shown in FIGS. 2 and 3, according to an embodiment of the invention, RF body coil 56 includes a body coil cover 80 that is wrapped around the RF support form 70 and RF electronics 78 in order to add mass to the RF body coil 56 and reduce the airborne and structural borne noise radiated by the RF body coil 56. The body coil cover 80 replaces the loading effect of the RF support form 70 and reduces the natural frequency of the RF legs 76. As such, the body coil cover 80 reduces the overall transferred vibration energy to the RF support form 70 and, such that the vibration of the RF legs 76 decreases and the overall acoustic noise is reduced. According to an exemplary embodiment, the body coil cover 80 is formed of a fiber reinforced plastic (FRP) having acoustic dampening properties.

As shown in FIG. 2, a majority of the length of the RF legs 76 is covered by the body coil cover 80 except for the ends 82, 84 of the legs. By leaving the ends 82, 84 of RF legs 76 uncovered, performance requirements of the RF body coil 56 can be maintained, while the covering of the remainder of the RF legs 76 with the body coil cover 80 beneficially provides adequate acoustic dampening. It is envisioned that the area/length of the RF legs 76 (and RF support form 70) covered by the body coil cover 80 can be optimized to minimize the amount of material used, while maintaining the noise reduction performance at a desired level. Similarly, it is envisioned that the thickness of the body coil cover 80 can be optimized to minimize the amount of material used, while maintaining the noise reduction performance at a desired level.

Figure 4:
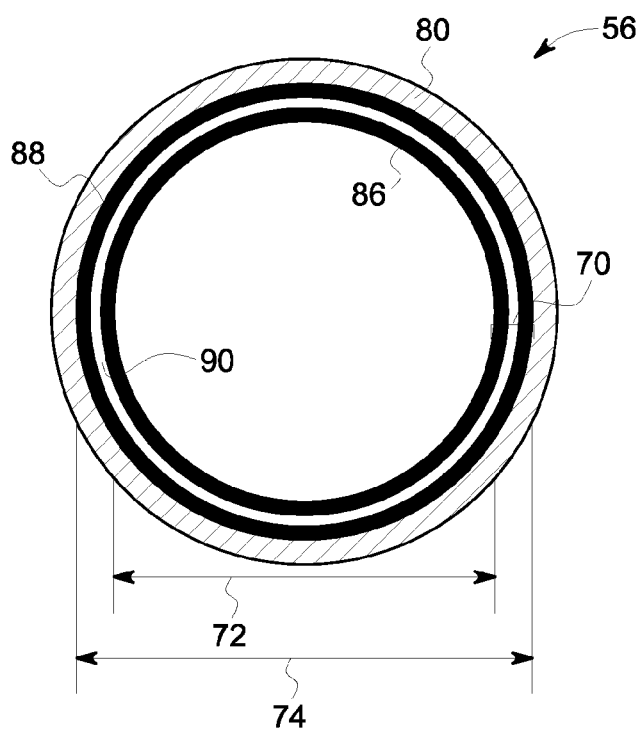
FIG. 4 is a front cross-sectional view of the RF body coil of FIG. 2 according to an embodiment of the invention.

Referring now to FIG. 4, a cross-sectional front view of an RF boy coil 56 is shown constructed in accordance with another embodiment of the invention. As shown in FIG. 4, a body coil cover 80 is wrapped around the RF support form 70 and RF electronics 78 (FIG. 2) in order to add mass to the RF body coil 56 and reduce the airborne and structural borne noise radiated by the RF body coil. Additionally, RF support form 70 is constructed as a multi-layer structure that includes a viscoelastic material integrated therein. That is, RF support form 70 is constructed to include an inner structural layer 86 made of a composite material, an outer structural layer 88 made of a composite material, and a viscoelastic layer 90 sandwiched in between the inner layer 86 and the outer layer 88 (i.e., a middle layer). The inner and outer structural layers 86, 88 may be formed of fiberglass or another suitable composite material, while the middle viscoelastic layer 90 may be formed of a viscoelastic foam or polymer, for example, or another suitable viscoelastic material. Inclusion of the viscoelastic layer 90 in the RF support form 70 serves to increase the mechanical damping of the RF body coil 56. The increasing of mechanical damping will reduce the RF body coil vibration and consequently reduce the airborne and structural borne acoustic noise radiated into the patient bore.

It is envisioned that the thickness of the sandwiched viscoelastic layer 90 can be optimized to improve mechanical damping of RF body coil 56. Similarly, it is envisioned that the location of the viscoelastic sandwiched layer 90 relative to the outer and inner diameter 72, 74 of the RF support form 70 can be optimized to improve mechanical damping of the RF body coil 56.

Figure 5:
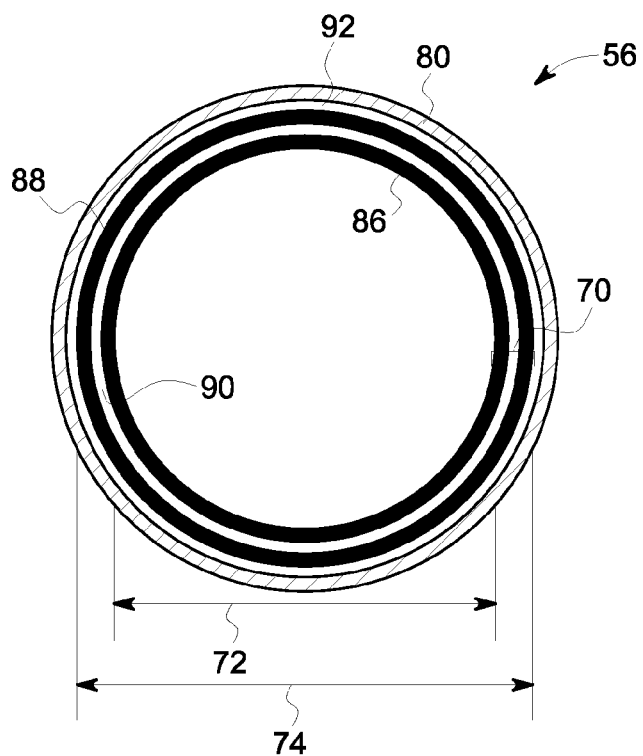
FIG. 5 is a front cross-sectional view of the RF body coil of FIG. 2 according to an embodiment of the invention.

In another embodiment, and as shown in FIG. 5, an additional layer of viscoelastic damping material 92 can be added between the RF support form 70 outer diameter 74 and the body coil cover 80 to improve mechanical damping of RF body coil 56. That is, the additional viscoelastic layer 92 serves to decouple and isolate the acoustic energy of the RF electronics 76 (FIG. 2) from the RF support form 70.

Embodiments of the invention thus provide an RF coil having a reduced acoustic output by providing vibration isolation between the RF electronics/conductor and the RF support form, as well as providing damping to reduce the vibration from the RF electronics/conductor to the RF support form. Beneficially, embodiments of the RF body coil use radial space in the MR system in an efficient manner that does not result in a larger gradient coil diameter or a smaller patient bore diameter.

Therefore, according to one embodiment of the invention, an RF body coil for an MR scanning apparatus includes an RF support form and RF electronics affixed to the RF support form, with the RF electronics comprising a plurality of RF legs. The RF support form further includes an inner structural layer, an outer structural layer, and a middle layer sandwiched between the inner structural layer and the outer structural layer, the middle layer comprising a layer of viscoelastic material configured to increase the mechanical damping of the RF body coil so as to reduce RF body coil vibration.

According to another embodiment of the invention, a method of constructing an RF body coil includes the steps of providing an RF support form of a generally cylindrical shape having an interior surface facing a patient bore and an exterior surface and affixing an RF conductor to the RF support form, the RF conductor comprising a plurality of RF antennas. The step of providing the RF support form further includes providing an inner structural layer, providing an outer structural layer, and including a middle layer of viscoelastic material sandwiched between the inner structural layer and the outer structural layer.

According to yet another embodiment of the invention, a magnetic resonance imaging (MRI) system includes an RF transceiver system to acquire MR images and a gradient coil assembly positioned about a bore of a magnet to impress a polarizing magnetic field, wherein the gradient coil assembly includes a polarizing magnet and RF body coil. The RF body coil further includes an RF support form and RF electronics affixed to the RF support form and having a plurality of RF legs. The RF support form includes a layer of viscoelastic material embedded therein, with the layer of viscoelastic material configured to increase the mechanical damping of the RF body coil so as to reduce RF body coil vibration.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An RF body coil for an MR scanning apparatus comprising:

an RF support form; and
RF electronics affixed to the RF support form, the RF electronics comprising a plurality of RF legs;
wherein the RF support form comprises:
an inner structural layer;
an outer structural layer; and
a middle layer sandwiched between the inner structural layer and the outer structural layer, the middle layer comprising a layer of viscoelastic material configured to increase the mechanical damping of the RF body coil so as to reduce RF body coil vibration.

2. The RF body coil of claim 1 further comprising a body coil cover wrapped around the RF support form and the RF electronics, the body coil cover configured to reduce vibration of the plurality of RF legs.

3. The RF body coil of claim 2 wherein the body coil cover comprises a fiber reinforced plastic (FRP) cover.

4. The RF body coil of claim 2 wherein each of the plurality of RF legs comprises a first end and a second end, and wherein the body coil cover is sized to cover a majority of a length of the plurality of RF legs, while leaving the first and second ends of each of the plurality of RF legs uncovered.

5. The RF body coil of claim 1 wherein the viscoelastic material of the middle layer comprises one of a viscoelastic foam and a viscoelastic polymer.

6. The RF body coil of claim 1 wherein the RF electronics are affixed to an outer surface of the RF support form.

7. The RF body coil of claim 6 further comprising an additional layer of viscoelastic material positioned between the outer surface of the RF support form and the RF electronics.

8. The RF body coil of claim 1 wherein the middle layer of viscoelastic material is configured to reduce airborne and structural borne acoustic noise generated by the RF body coil.

9. A method of constructing an RF body coil comprising:

providing an RF support form of a generally cylindrical shape having an interior surface facing a patient bore and an exterior surface; and
affixing an RF conductor to the RF support form, the RF conductor comprising a plurality of RF antennas;
wherein providing the RF support form comprises:
providing an inner structural layer;
providing an outer structural layer; and
including a middle layer of viscoelastic material sandwiched between the inner structural layer and the outer structural layer.

10. The method of claim 9 wherein the viscoelastic material comprises one of a viscoelastic foam and a viscoelastic polymer.

11. The method of claim 9 further comprising affixing a body coil cover to the exterior surface of the RF support form and about the RF conductor.

12. The method of claim 11 wherein affixing the body coil cover comprises affixing the body coil cover such that the body coil cover covers a majority of a length of the RF antennas while leaving opposing ends of the RF antennas uncovered.

13. The method of claim 11 wherein the body coil cover comprises a fiber reinforced plastic (FRP) material.

14. A magnetic resonance imaging (MRI) system comprising:

an RF transceiver system to acquire MR images; and
a gradient coil assembly positioned about a bore of a magnet to impress a polarizing magnetic field, wherein the gradient coil assembly includes a polarizing magnet and RF body coil, wherein the RF body coil includes:
an RF support form; and RF electronics affixed to the RF support form, the RF electronics comprising a plurality of RF legs;

wherein the RF support form comprises a layer of viscoelastic material embedded therein, the layer of viscoelastic material configured to increase the mechanical damping of the RF body coil so as to reduce RF body coil vibration.

15. The MRI system of claim 14 wherein the RF support form comprises:

an inner structural layer;

an outer structural layer; and the layer of viscoelastic material sandwiched between the inner structural layer and the outer structural layer.

16. The MRI system of claim 14 further comprising a body coil cover wrapped around the RF support form and the RF electronics, the body coil cover configured to reduce vibration of the plurality of RF legs.

17. The MRI system of claim 16 wherein the body coil cover comprises a fiber reinforced plastic (FRP) cover.

18. The MRI system of claim 16 wherein the body coil cover is sized to cover a majority of a length of the plurality of RF legs, while leaving opposing first and second ends of each of the plurality of RF legs uncovered.

19. The MRI system of claim 14 wherein the viscoelastic material comprises one of a viscoelastic foam and a viscoelastic polymer.

20. The MRI system of claim 14 wherein the layer of viscoelastic material is configured to reduce airborne and structural borne acoustic noise radiated into the bore.

* * * * *